United States Patent
Balayer et al.

(10) Patent No.: US 9,590,578 B2
(45) Date of Patent: Mar. 7, 2017

(54) AMPLIFIER DEVICE WITH AT LEAST ONE MICROWAVE TUBE

(71) Applicant: THALES, Courbevoie (FR)

(72) Inventors: Christophe Balayer, Toulouse (FR); Bruno Trancart, Toulouse (FR)

(73) Assignee: Thales, Courbevoie (FR)

( * ) Notice: Subject to any disclaimer, the term of this patent is extended or adjusted under 35 U.S.C. 154(b) by 0 days.

(21) Appl. No.: 14/791,135

(22) Filed: Jul. 2, 2015

(65) Prior Publication Data

US 2016/0006405 A1   Jan. 7, 2016

(30) Foreign Application Priority Data

Jul. 4, 2014 (FR) ..................... 14 01508

(51) Int. Cl.
| | |
|---|---|
| H03F 3/54 | (2006.01) |
| H01J 23/34 | (2006.01) |
| H04B 7/185 | (2006.01) |
| H03F 3/56 | (2006.01) |
| H03F 3/58 | (2006.01) |

(52) U.S. Cl.
CPC ............. H03F 3/54 (2013.01); H01J 23/34 (2013.01); H03F 3/56 (2013.01); H03F 3/58 (2013.01); H04B 7/18515 (2013.01); *H03F 2200/451* (2013.01)

(58) Field of Classification Search
CPC ................. H03F 1/00; H03F 3/58; H03F 3/54
USPC ........................................ 330/41-44
See application file for complete search history.

(56) References Cited

U.S. PATENT DOCUMENTS

| | | | | |
|---|---|---|---|---|
| 3,173,102 | A * | 3/1965 | Loewenstern, Jr. | H01L 45/02 257/162 |
| 6,369,511 | B1 * | 4/2002 | Matsuoka | H01J 23/0275 315/3.5 |
| 6,489,842 | B2 * | 12/2002 | Eng | H03F 3/58 330/124 R |
| 7,071,624 | B2 * | 7/2006 | Tsuchida | H01J 25/34 315/3.5 |
| 7,131,484 | B2 | 11/2006 | Gayrard et al. | |
| 8,723,137 | B1 * | 5/2014 | Hwu | H01F 7/0278 250/396 ML |
| 2002/0089372 | A1 | 7/2002 | Eng | |

* cited by examiner

*Primary Examiner* — Henry Choe
(74) *Attorney, Agent, or Firm* — Baker Hostetler LLP

(57) ABSTRACT

An amplifier device with at least one microwave tube, intended to be mounted on a satellite, includes a high voltage section directly connected to said microwave tube or tubes, a low voltage section, and a low voltage cabling assembly provided with low voltage connectors at the ends thereof connecting said low and high voltage sections.

8 Claims, 4 Drawing Sheets

AMPLIFIER DEVICE WITH AT LEAST ONE MICROWAVE TUBE

CROSS-REFERENCE TO RELATED APPLICATION

This application claims priority to foreign French patent application No. FR 1401508, filed on Jul. 4, 2014, the disclosure of which is incorporated by reference in its entirety.

FIELD OF THE INVENTION

The invention relates to an amplifier device with at least one microwave tube, such as a travelling wave tube or a klystron, notably for satellites.

BACKGROUND

The arrangements of the satellite panels supporting the payload are complex, notably owing to the lack of flexibility of amplifying devices with at least one microwave tube.

FIG. 1 illustrates such an amplifier device with at least one microwave tube, according to the prior art.

Such a device includes an electrical power supply portion 1 of the RF amplifier and an amplifier portion RF 2.

The electrical power supply portion 1 includes a low voltage pre-regulator 3, a control and telemetry signal management module 4, and a high voltage converter 5.

Low voltage is understood to mean a voltage below 200 volts, and high voltage a voltage above 200 volts.

The pre-regulator 3 is connected to the power supply bus 6 of the satellite via an interface connector 7, and the management module 4 is connected to the control and telemetry signal bus 8 via an interface connector 9;

The RF amplifier portion 2 includes at least one microwave tube 10 provided with an RF signal input 11 and an amplified RF signal output 12. A connector-less fixed-mounted high voltage power supply cable 13 connects the electrical power supply portion 1 of the RF amplifier and the RF amplifier portion 2.

Integrating such an amplifier device requires two to three people since the installation calls for a great deal of caution. In addition, such a device complicates the mounting of these elements on panels of different physical levels.

It is necessary to define the lengths of high voltage electrical cables at a very early stage in the phase of defining the payload for reasons of manufacturing cycle time, which prevents the optimization of their length and involves a disadvantageous approach to their sizing, since these cables are long, heavy and difficult to install. It is impossible, after manufacturing such an amplifier device, to exchange it with another.

The conventional design of such an amplifier device uses a high voltage cable entailing equipment layout constraints on the payload panel, and a generally oversized length of cable since it has to be determined very early in the production phases.

Consequently, such embodiments involve additional costs and weight increases in the overall payload, as well as problems of progress schedule delays in the step of integrating or replacing the amplifier device.

SUMMARY OF THE INVENTION

One object of the invention is to overcome the aforementioned drawbacks.

Consequently, according to one aspect of the invention, an amplifier device is provided with at least one microwave tube, intended to be mounted on a satellite, including a high voltage section directly connected to said microwave tube or tubes, a low voltage section, and a low voltage cabling assembly provided with low voltage connectors at the ends thereof connecting said low and high voltage sections, said high voltage section being arranged on the same base plate as the microwave tube or tubes.

Such a device, in which the low voltage portion and the high voltage portion are separate and in which these two portions are connected by a low voltage cabling assembly provided with low voltage connectors at the ends thereof, drastically reduces the costs of integration of such a device in a satellite.

Indeed, it is no longer necessary to use oversized lengths of cables, or to have two to three persons for carrying out the mounting, or to select a cable a long time in advance.

Such a device makes it possible to install the high voltage section of the amplifier device as close as possible to or on the same base plate as the microwave tube or tubes, which avoids the need for any costly interconnection via high voltage cable between the two sections, and not allowing disconnection in the space environment (delicate insulation).

Base plate is understood to mean a metal plate whereon the body or bodies of the microwave tube or tubes is/are installed and whereof the function is, firstly, to allow mechanical mounting of the device on the panel of a satellite according to the rules of the art, and secondly to ensure a suitable contact surface for an optimum heat exchange with the panel. Putting the high voltage section on the same base plate as the microwave tube or tubes is possible thanks to the use of recent components being able to operate at very high temperatures, typically temperatures above 110° C.

In one embodiment, said low voltage cabling assembly includes at least one low voltage electrical power supply cable and a control and telemetry signal bus.

Thus, such a cable is easy to produce and may then be provided with connectors at both ends thereof.

According one embodiment, said low voltage section includes a low voltage pre-regulator module, and a control and telemetry signal management module.

Thus, the solutions and technologies used both in power electronics and for telemetry and remote control signal management circuits belong to common fields such as those of low frequency and low voltage and may thus be grouped together.

In one embodiment, said high voltage section includes a high voltage generator module, and a control and telemetry signal processing module.

Thus, the high voltage generator module needs to be controlled by low level signals and must supply telemetry information in return. The coding and/or decoding of these signals by the processing module must be performed as close as possible to the high voltage generator module and in order to have features for transmitting same without distortion via the cable.

In one embodiment, said high voltage generator module of said high voltage section includes:
 a low voltage to high voltage converter module; and
 a high voltage rectifier and filter module.

Thus, the two functions of the modules use very different production technologies and must be separate. In particular, the high voltage section requires quite special electrical insulation precautions in the implementation of same.

For example, said high voltage section further includes a control module for activating/deactivating the microwave tube or tubes.

Thus, a microwave tube requires having many power supply voltages from the various different electrodes thereof and must be started according to a quite special sequencing.

In one embodiment, said low voltage is less than 200 V.

Thus, the low voltage section has the function of pre-regulating the satellite bus voltage even before converting it in the form of ultra-stable voltages usable by the microwave tube.

According to one embodiment, said low voltage is more than 200 V.

These high voltages are necessary for achieving the speed, phase and focusing parameters of the electron beam enabling the mechanism for amplifying the microwave within the tube.

According to another aspect of the invention, a satellite is provided including a device as previously described.

BRIEF DESCRIPTION OF THE DRAWINGS

The invention will be better understood from the study of some embodiments described by way of non-restrictive examples and illustrated by the accompanying drawings in which.

DETAILED DESCRIPTION

In all the figures, elements having the same references are similar. In the present description, the device is described for being integrated into a satellite, but in a non-restrictive way, since such a device may be integrated into any other system, notably a space system.

Figure 1:
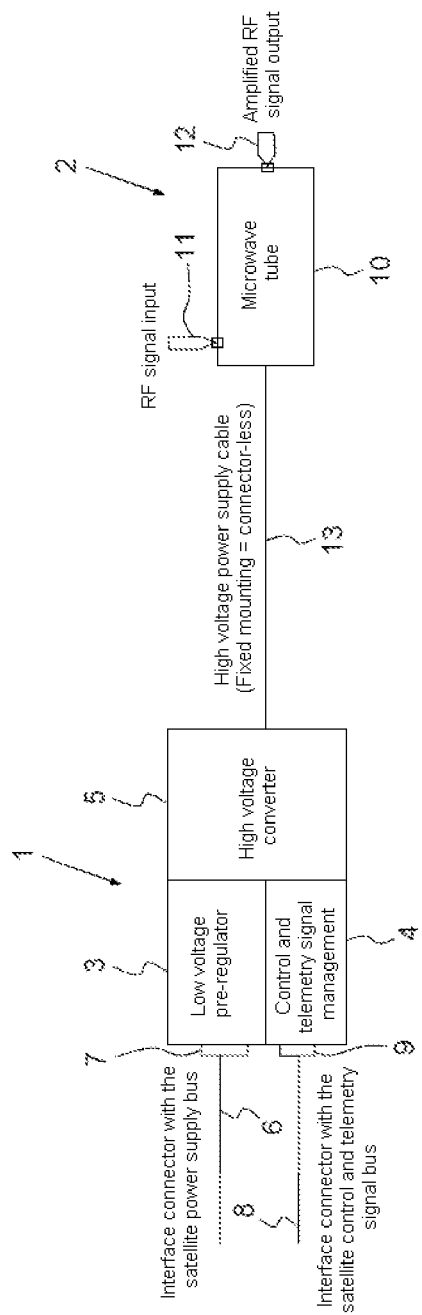
FIG. 1 schematically illustrates an amplifier device with at least one microwave tube, according to the prior art.
Figure 2:
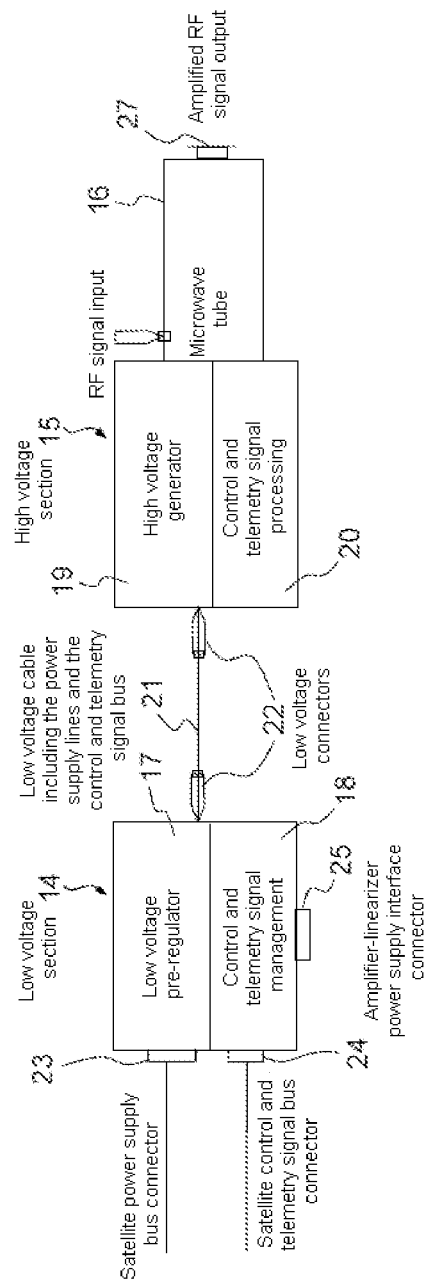
FIGS. 2 to 4 schematically illustrate an amplifier device with at least one microwave tube, according to various aspects of the invention.

As illustrated in FIG. 2, an amplifier device is provided according to one aspect of the invention.

The amplifier device includes a low voltage section 14, a high voltage section 15, and at least one microwave tube 16, in this case, non-restrictively, a single one.

The low voltage section 14 includes a low voltage pre-regulator module 17, and a control and telemetry signal management module 18.

The high voltage section 15 includes a high voltage generator module 19, and a control and telemetry signal processing module 20.

A low voltage cabling assembly 21 provided with low voltage connectors 22 at the ends thereof connects the low voltage section 14 and the high voltage section 15.

The low voltage section 14 is provided with a bus connector 23 for the satellite electrical power supply for connecting the low voltage pre-regulator module 17 to the satellite electrical power supply bus, a bus connector 24 for the satellite control and telemetry signals for connecting the control and telemetry signal management module 18 and the satellite control and telemetry signal bus, and an amplifier-linearizer power supply interface connector 25 for connecting the control and telemetry signal management module 18 and the amplifier-linearizer.

The microwave tube 16 is provided with an RF signal input 11 and an amplified RF signal output 12.

Figure 3:
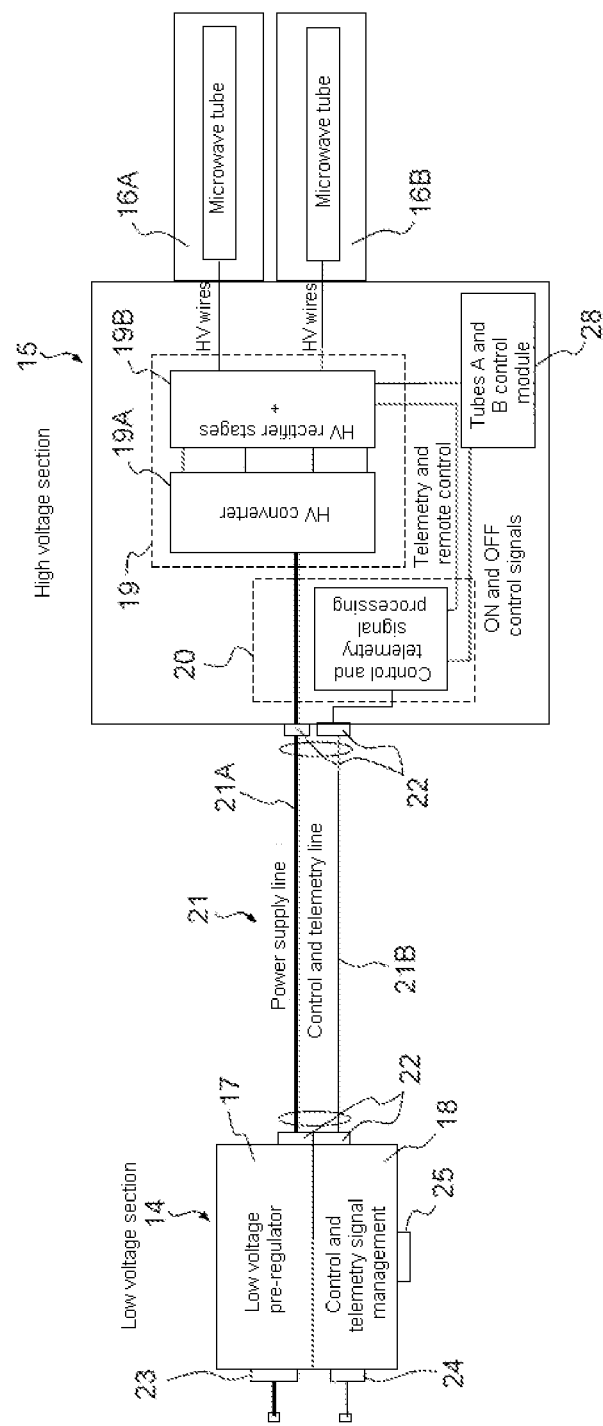

FIG. 3 illustrates a particular embodiment of FIG. 2.

The low voltage cabling assembly 21 may include at least one low voltage electrical power supply cable 21A and a control and telemetry signal bus 21B.

In this embodiment, the high voltage generator module 19 of the high voltage section 15 includes a low voltage to high voltage converter module 19A and a high voltage rectifier and filter module 19B.

In addition, the high voltage section 15 further includes a control module 28 for activating/deactivating the microwave tube or tubes, in this case two microwave tubes 16A and 16B. This control module 28 for activating/deactivating the microwave tubes 16A and 16B is used to decode and format signals emanating from the management module 18 via the bus 21B which are dedicated to the processing module 20 integrated into the high voltage section 15. The management module 18 is a device directly interfacing with the remote control and telemetry signal bus and identifies these signals in order to adapt and direct same towards the functions of the pre-regulator module 17 of the low voltage section 14 or towards the control and telemetry signal processing module 20 of the high voltage section 15 via the cable 21 integrating the bus 21B to do so.

Figure 4:
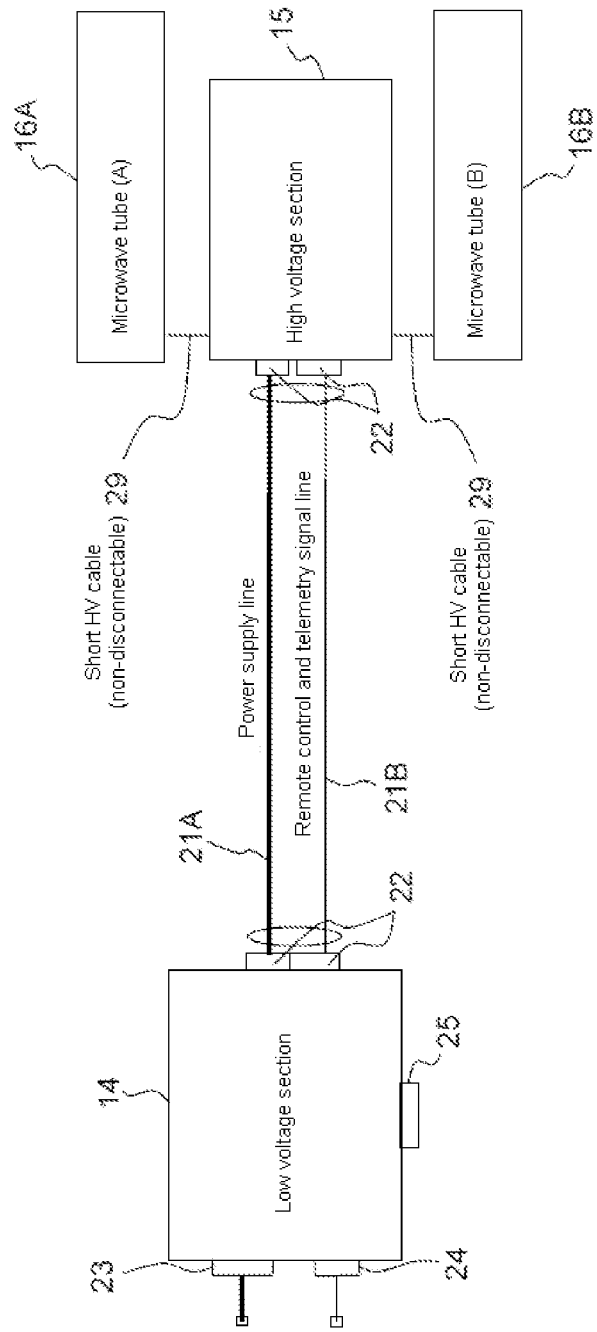

FIG. 4 schematically represents one embodiment of the invention in which said microwave tubes, in this case the two microwave tubes 16A and 16B are connected to the high voltage section 15 via short distance high voltage electrical cables 29, i.e. one to five tens of centimetres in length much less than the distance of the disconnectable cable 21 having a typical length of one to five metres.

The invention claimed is:

1. An amplifier device with at least one microwave tube, configured to be mounted on a satellite, including a high voltage section directly connected to said microwave tube or tubes, a low voltage section, and a low voltage cabling assembly provided with low voltage connectors at the ends thereof connecting said low and high voltage sections, said high voltage section being arranged on the same base plate as the microwave tube or tubes, wherein said low voltage section includes a low voltage pre-regulator module, and a control and telemetry signal management module.

2. The device according to claim 1, wherein said low voltage cabling assembly includes at least one low voltage electrical power supply cable and a control and telemetry signal bus.

3. The device according to claim 1, wherein said high voltage section includes a high voltage generator module and a control and telemetry signal processing module.

4. The device according to claim 1, wherein said high voltage generator module of said high voltage section includes:
a low voltage to high voltage converter module; and
a high voltage rectifier and filter module.

5. The device according to claim 4, wherein said high voltage section includes a control module for activating/deactivating the microwave tube or tubes.

6. The device according to claim 1, wherein said low voltage is less than 200 V.

7. The device according to claim 1, wherein said high voltage is more than 200 V.

8. A satellite including a device according to claim 1.

* * * * *